United States Patent [19]
Lambert et al.

[11] 4,254,707
[45] Mar. 10, 1981

[54] SCREEN PRINTING APPARATUS WITH SCREEN PEEL-OFF FROM WORK

[75] Inventors: Daryl G. Lambert, Phoenix; Howard M. Sage; Lee W. Ester, both of Glendale, all of Ariz.

[73] Assignee: Itron, Inc., Phoenix, Ariz.

[21] Appl. No.: 35,338

[22] Filed: May 2, 1979

[51] Int. Cl.$^3$ .............................................. B41F 15/46
[52] U.S. Cl. .............................. 101/123; 101/127.1; 101/129
[58] Field of Search ............ 101/123, 129, 124, 127.1, 101/126

[56] References Cited

U.S. PATENT DOCUMENTS

| | | | |
|---|---|---|---|
| 1,891,622 | 12/1932 | Flockhart | 101/123 |
| 1,898,406 | 2/1933 | Tate | 101/123 |
| 2,355,930 | 8/1944 | Thorne | 101/123 |
| 3,650,208 | 3/1972 | Lambert | 101/123 |
| 3,731,623 | 5/1973 | Bubley | 101/123 |
| 3,788,215 | 1/1974 | Lambert | 101/123 |
| 3,859,917 | 1/1975 | Bubley | 101/123 |

FOREIGN PATENT DOCUMENTS 1207836  9/1959  France ..................... 101/123

*Primary Examiner*—Clyde I. Coughenour
*Attorney, Agent, or Firm*—Paul and Paul

[57] ABSTRACT

A screen printing apparatus is provided, having a table on which the blank to be printed may be placed, and with the screen being brought into overlying relation to the blank for engagement of the screen by a squeegee for forcing through the screen, ink that has been applied to the screen, onto the work, with the squeegee generally downwardly pressing the screen a predetermined amount, to engagement with the work, as the squeegee traverses the screen from one end to the other. The screen is pivotally mounted at one end, and the other end is upwardly liftable to peel-off the screen from the work, as the squeegee traverses, so that those portions of the screen through which ink has already been applied to the work may be physically removed from the work to prevent smearing of ink on the work, as well as to prevent distortion. The upward movement of the screen away from the work is synchronized with the traversal of the squeegee across the screen. The traversing movement of the squeegee is of the single sided rack-and-pinion drive type and a bar that carries the squeegee as it moves in its traversing movement also actuates a mechanism for pivoting a shaft that, in turn, effects the raising motion of the screen. Adjustment isprovided for controlling the amount that squeegee traversal will raise the screen off the work.

3 Claims, 8 Drawing Figures

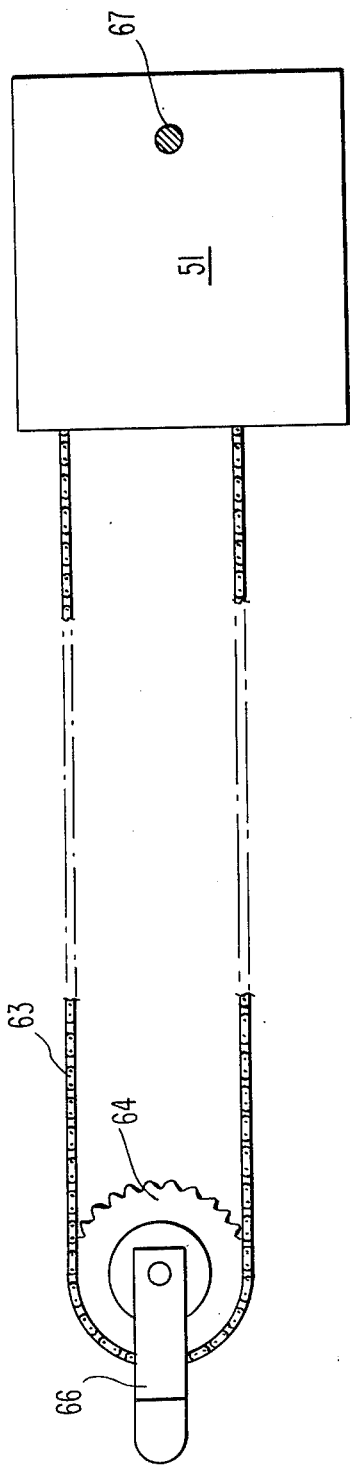
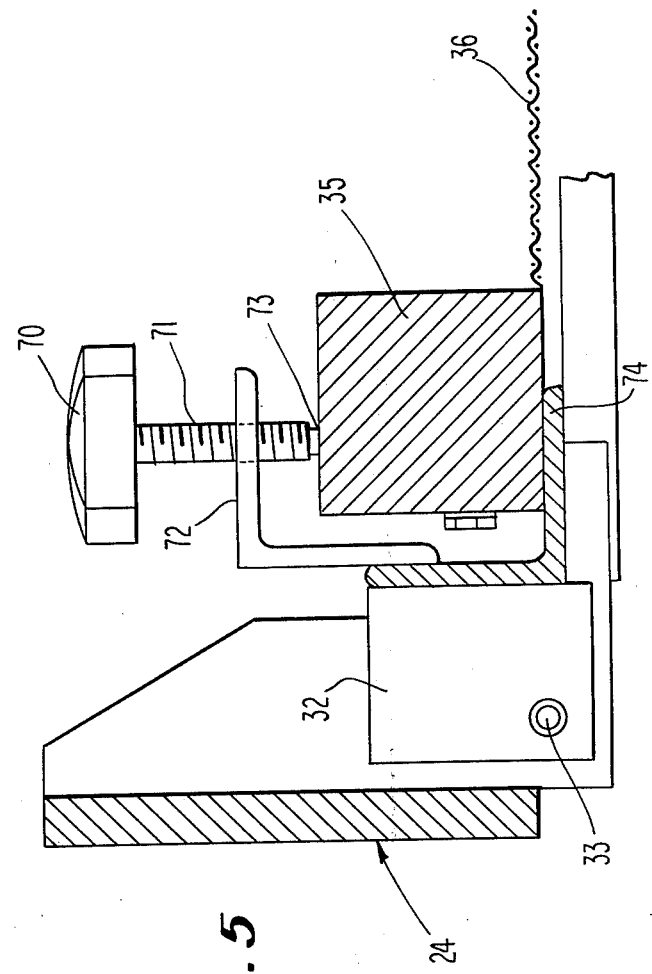
Fig. 4
Fig. 5

SCREEN PRINTING APPARATUS WITH SCREEN PEEL-OFF FROM WORK

BACKGROUND OF THE INVENTION

I. Field of the Invention

This invention relates to screen printing machines, particularly screen printing machines for use where extremely close tolerances are necessary, for example, in a manufacture of printed circuit boards, printed circuit film, and in the graphic arts and in other manufactures where very close tolerances and/or very fine images are desired on the blanks or work.

II. Description of the Prior Art

Screen printing is an art that generally involves the employment of a platen or table, which has a flat surface supporting a planar blank or piece of "work". A screen, generally comprising a rectangular grid of thin wires, commonly called a silk screen, is brought into overlying relation to the blank, generally not immediately adjacent the blank, but a short distance disposed thereabove. The screen wires are under substantial tension. A stencil has, at this point, already been built into the screen, generally by the use of solidifiable liquids, filling the pores of the holes, where desired, such that when such solidifiable liquids are dried, they define the image on the screen that is to be the stencil for blocking areas where ink applied through the screen to the blank below, will not appear. With the screen into position just above the blank, ink is forced or pumped through the unstenciled openings in the screen to produce a printed pattern on the blank of material therebelow. Generally, the ink is forced through the screen by a squeegee, that is moved in a traversing movement across the screen, and which is the means for pumping the ink through the screen stencil, onto the work, as it presses the screen against the work.

in the electronic industry, printed circuit boards, printed circuit film, and other unyielding, sometimes rigid, and generally non-porous substrates are used. These boards, substrates and the like, generally involve the removal of unprinted metal from a generally uniform metallic surface on the blank. This metal is removed generally by printing resist or masking liquid (generally referred to herein as ink) on localized regions of the blank. After the resist dries, or is solidified by the use of photopolymerizable ink, or heat cured inks and coatings or the like, the boards, films, or the like may be etched or otherwise subjected to removal operations, for removal of metal from the desired (unprinted) localized regions of the metallic surfaces. The electrical characteristics of the work are often determined by the thickness of the metallic layer remaining and its lateral dimensions. Accordingly, the fidelity of the printing when resist is applied to the work, greatly affects the quality of the final printed circuit product. Additionally, in the electronic industry, after the printed circuit board, film, etc., is completely etched and cleaned, it often becomes desirable to cover these items with a cover coating, in order to prevent damage to the electrical circuits, during shipment, during further processing, etc. To this end, it may be desired to use screen printing techniques without a stencil.

In the course of screen printing, the squeegee is generally driven across the screen, but in so doing, it engages the screen and it pushes the screen down a slight amount into engagement with the "work" or substrate. This is so that the inherent resilience of the screen will cause it to be drawn away from the substrate as the blade of the squeegee passes printed portions of the substrate. This pulling away of the screen is referred to as "snap-off". During snap-off, the tacky ink-wetted screen is pulled away from the substrate under the influence of the highly tensioned screen fabric. When tacky inks are used, smearing may become a problem, particularly when printing large solid areas. Additionally, where printing of fine dimensions, such as parallel lines is desired, particularly, again, when tacky inks are used, but even when less tacky inks are used, sharp resolution is negatively affected, and distortions can occur.

SPECIFIC REFERENCE TO PRIOR ART

The present invention is an improvement upon screen printing apparatus of U.S. Pat. Nos. 3,788,215 and 3,650,208, the entire disclosure of which is herein incorporated by reference.

SUMMARY OF THE INVENTION

The present invention is directed to the mechanical peeling-off of the screen from the substrate, to assure precise snap-off by moving the screen (generally by engaging the screen frame) away from the substrate, such movement being in synchronization with the traversal of the squeegee across the screen. Thus, the screen is lifted away from the substrate at an increasing angle as the blade of the squeegee moves along the screen, and from the point of contact of the blade of the squeegee with the screen. A preferred embodiment of this invention assures that the squeegee-to-snap-off relationship will remain in synchronization at any squeegee speed or stroke length. An additional feature of one embodiment of this invention is that feature whereby a pivot for the screen frame is located in the plane of the screen, whereby any distortion such as elongation which might result if the pivot were located below the plane of the screen, is minimized.

BRIEF DESCRIPTIONS OF THE DRAWING FIGURES

Figure 3:
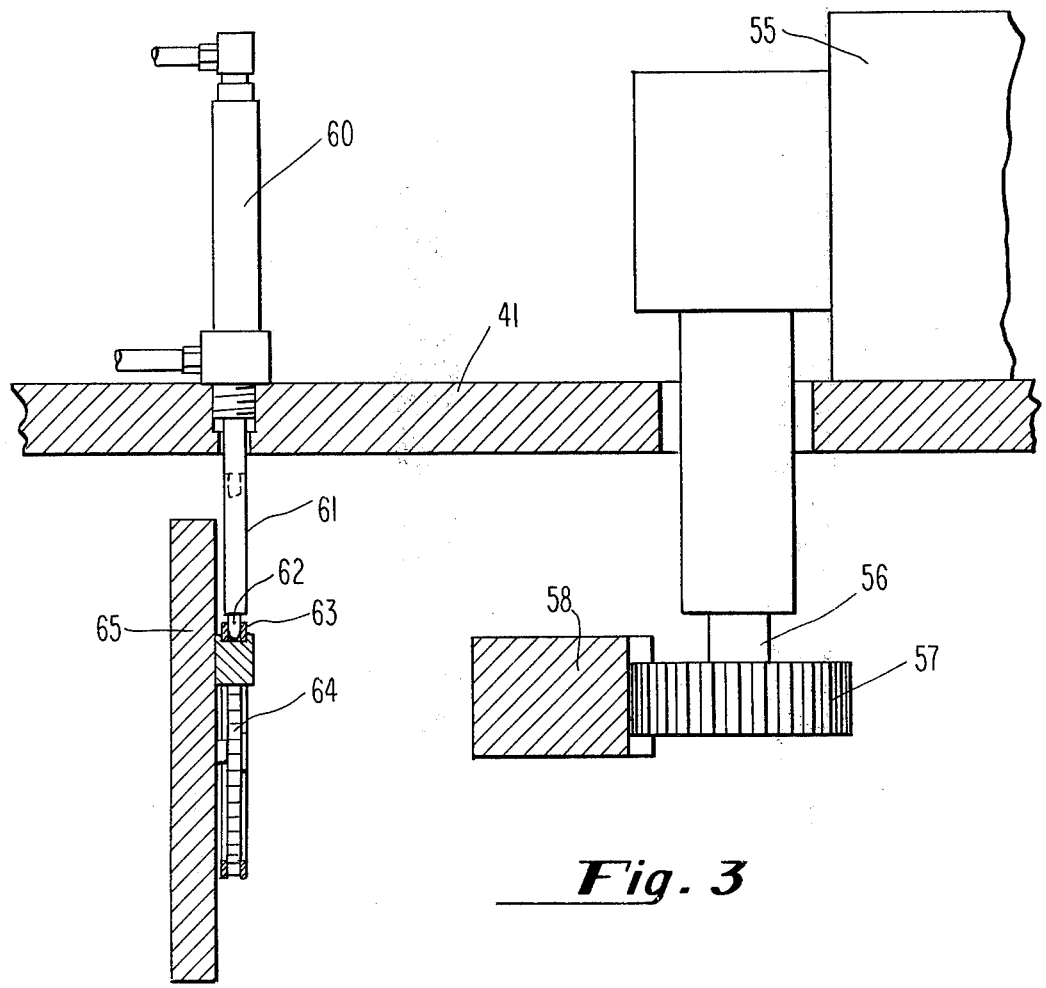
Figure 2:
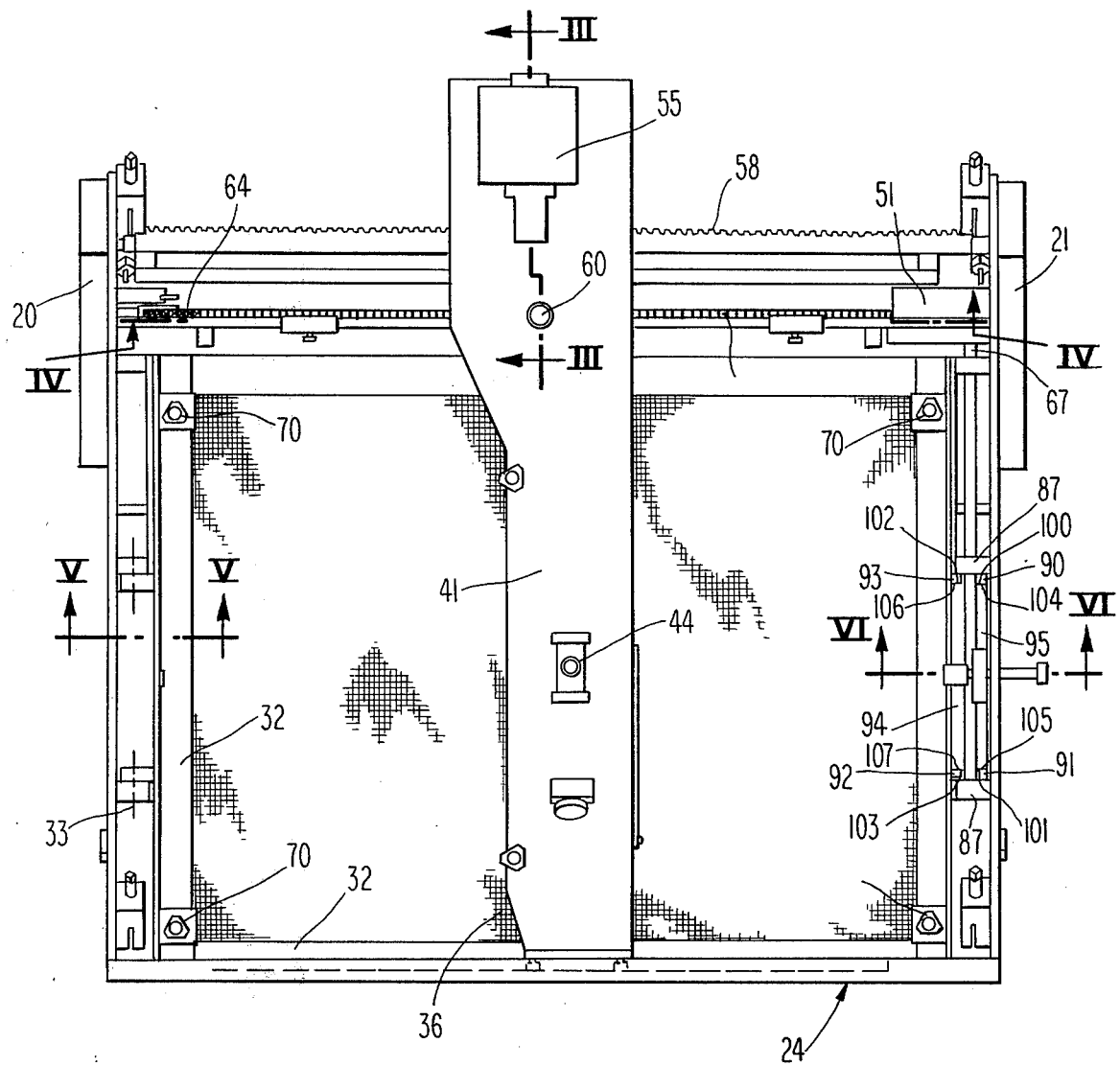
FIG. 2 is a top plan view of the apparatus in accordance with this invention, wherein the squeegee mounting bar for traversal of the squeegee, and the synchronized pivot shaft for lifting of the screen frame, are particularly illustrated.

FIG. 3 is an enlarged vertical sectional view taken generally along the line III-III of FIG. 2, and wherein the synchronization of the motor for driving the squeegee traverse bar by engagement of a motor shaft with a rack carried by the frame is shown to provide traversing motion to the squeegee traverse bar, which in turn, allows for engagement of an air cylinder operated probe carried by the traverse bar with a continuous chain that drives the screen frame lifting shaft.

FIG. 4 is a partially broken vertical view taken generally along the line IV—IV of FIG. 2, and wherein the chain drive to a transmission is illustrated.

FIG. 5 is an enlarged vertical sectional view taken generally along the line V—V of FIG. 2, and wherein the screen frame pivot point for lifting of the screen is particularly illustrated.

Figure 6:
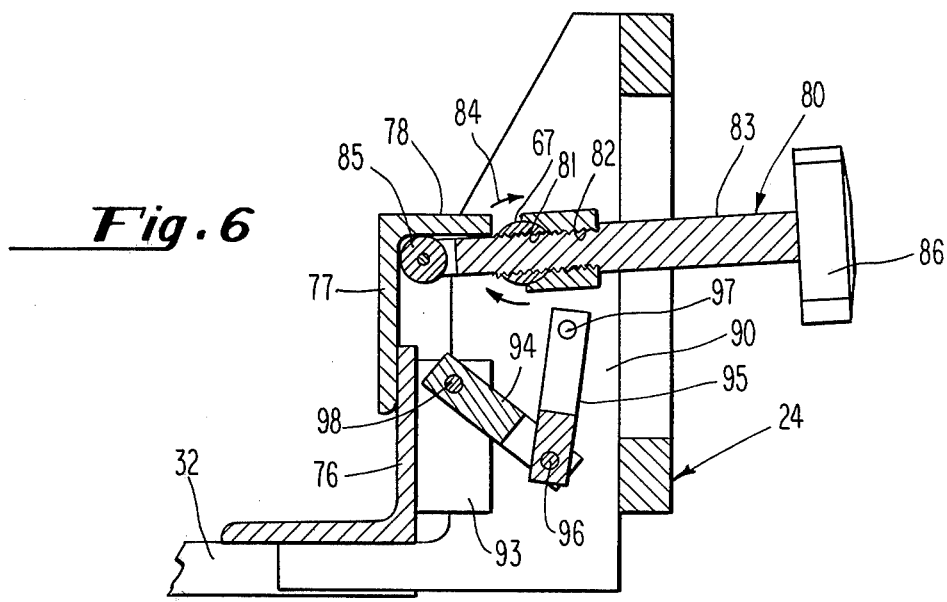

FIG. 6 is an enlarged vertical sectional view taken generally along the line VI—VI of FIG. 2, and wherein the adjustment feature for adjusting the amount of lift of the screen as the bar traverses, is illustrated, with the screen being illustrated in a no-lift position.

Figure 6A:
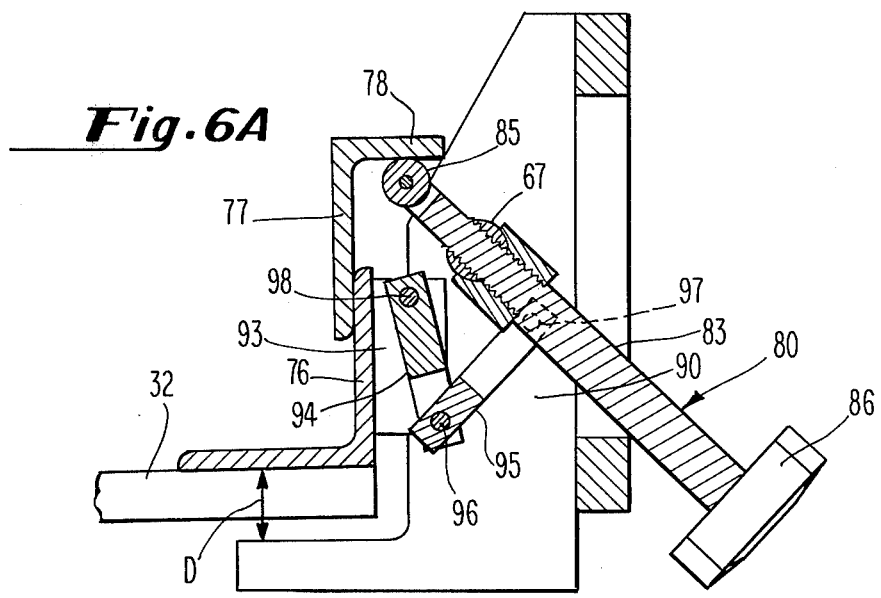

FIG. 6A is a view similar to that of FIG. 6, but with the screen being illustrated in its fully lifted position.

Figure 7:
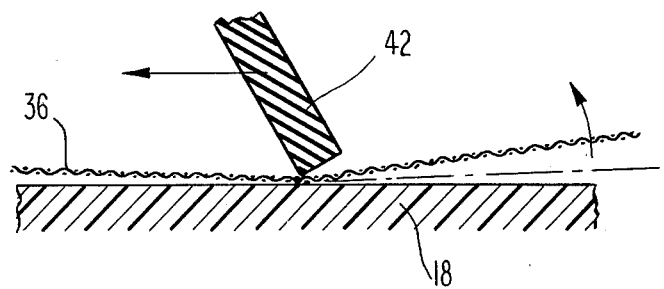

FIG. 7 is an enlarged fragmentary vertical sectional view, comprising a schematic illustration of the manner in which a squeegee blade urges a downwardly tensioned screen against a substrate, and the manner in which the upward lifting motion to the screen angles the screen away from the substrate at a more widely opening angle than if the lifting of the screen was not effected.

DETAILED DESCRIPTION OF THE PREFERRED EMBODIMENTS

Figure 1:
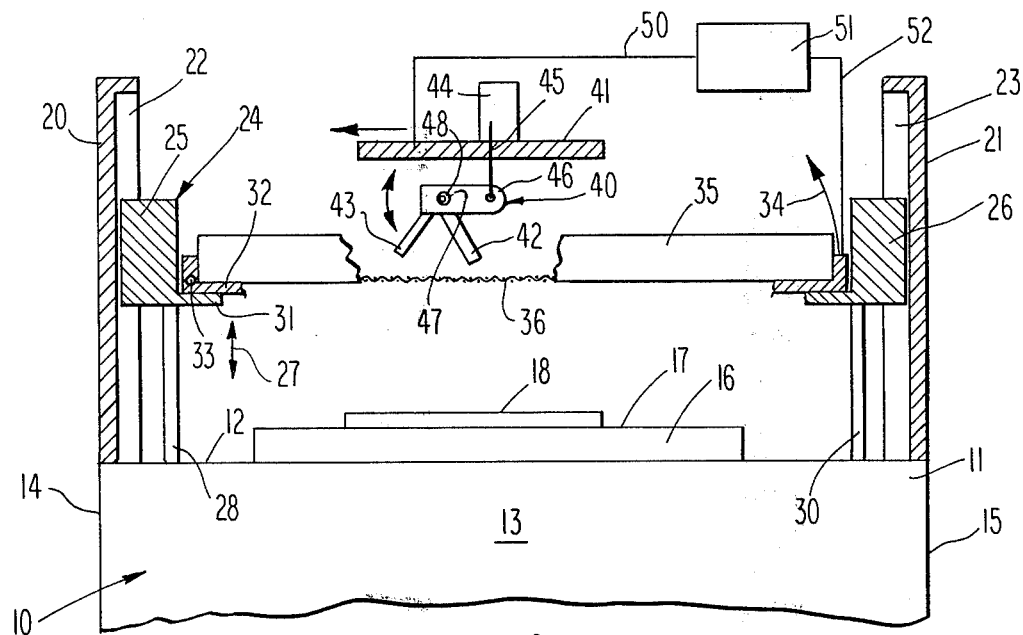
FIG. 1 is a schematic illustration, partially in vertical section and partially in vertical elevation, of a screen printing apparatus in accordance with this invention.

Referring now to the drawings in detail, reference is first made to FIG. 1, wherein, in schematic illustration, there is shown the apparatus 10 of the invention which comprises a screen printing apparatus, having a stationary table 11 of cabinet construction having a top 12 and including a front panel 13, left and right side panels 14 and 15, respectively, and a rear panel (unnumbered) opposite the front panel 13. The front panel 13 may carry suitable controls or the like (not shown). The interior of the table 11 carries the components necessary to the operation of the screen printing apparatus 10, such as containers (not shown) for holding the ink and other materials, and the same are not specifically illustrated herein, in that the invention herein is not specifically addressed to such features. Moreover, to a large extent, the apparatus of this invention operates similarly to the apparatus of U.S. Pat. Nos. 3,788,215 and 3,650,208, and many of the structural features, hardware, and operational components are the same. To the extent that there is similarity between the apparatus of this invention and that of U.S. Pat. Nos. 3,788,215 and 3,650,208, in many instances such similar structures are not specifically illustrated herein, in view of the incorporation by reference of the disclosure of that U.S. patent, and in order to avoid duplicaton herein.

The tabletop 12 carries a raised platen or a support 16, having a perforated upper surface 17, for vacuum drawing from inside the table 11, as a hold-down means, of a blank, "work", or other substrate 18 thereon. It will be understood that such substrate 18 or the like may comprise printed circuit film, a printed circuit board, any graphic arts substrate, or any other substrate adapted for use with the present invention.

Mounted on the top 12 of the table, are a pair of rearwardly raked guiding support members 20 and 21, respectively disposed at the left and right sides of the machine 14 and 15. These members 20 and 21 are rigidly carried on the top surface 12 of the apparatus 10, and have therein respectively associated guideways 22 and 23. A moveable carriage assembly 24 (rectangular as viewed in plan view, for example, as viewed in FIG. 2) has side portions 25 and 26, guideable on guideways 22 and 23, respectively, for generally vertical raising and lowering motion in the direction of the double headed arrow 27 illustrated in FIG. 1. It will be noted that the vertical guiding movement for the carriage assembly 24 is not precisely vertical, in that the carriage assembly 24, upon being raised upwardly by means of piston rods 28, 30, connected to suitable electrically operated fluid drive cylinders (not shown) (or optionally by means of a yoke device connected to a single cylinder) inside the cabinet of tabletop 12 moves somewhat toward the rear, away from front surface 13, during such upward movement.

The carriage assembly 24 is provided with a flange 31 disposed thereabout, in which sits a rectangular (as viewed in top plan) screen frame support 32, of angle iron or like construction (shown broken away for purposes of clarity). The screen frame support 32 is pivotally mounted for pivotal movement about an axis 33 disposed at the left side of the screen frame support 32, as the screen frame support 32 is pivoted upwardly by being engaged at its right-most end as viewed in FIG. 1, and with the right-most end being pivoted in the direction of the arcuate arrow 34, such engagement of the right most end of the screen frame support being by means that will be specifically discussed hereinafter.

A screen frame 35 is, in turn, supportingly carried on the screen frame support 32, such screen frame 35 likewise being rectangular in plan view, and being illustrated fragmentally in FIG. 1, for the sake of clarity. The screen frame 35 carries the screen 36 attached thereto at its lower end. The screen 36 comprises the grid of wires or the like through which ink passes. It is thus seen that the screen 36 is supportingly carried for vertical movement with respect to guide support 20 and 21, and the screen is likewise pivotally movable in the direction of the arrow 34, about axis 33, which axis 33 is in the same generally horizontal plane as the screen 36.

In the course of operation of the apparatus as set forth in FIG. 1, the screen 36 will be lowered until it is just above contact with the work 18 (within the range of a few thousandths of an inch to a quarter of an inch or more), or within such other close range as is desired for the particular job to be done, and the screen will be maintained at that particular height during the printing operation. A squeegee assembly 40 is provided, carried by a squeegee traversing bar 41, such assembly and bar being carried for vertical movement with the carriage assembly 24, but likewise being movable leftwardly and rightwardly as viewed in FIG. 1, during the application of printing ink to the work 18, through the screen 36.

When it is desired to pump ink through the screen 36 onto work 18, ink is applied to the screen 36 by means known in the art (not shown), and the bar 41 is moved to right-most position as illustrated in FIG. 1, and the squeegee assembly 40 is disposed with its squeegee blade 42 and flood blade 43, positioned substantially as shown in FIG. 1, and the bar 41 is then moved leftwardly, traversing the screen 36, with the blade 42 pumping or urging ink through the screen. It will be noted at this point that the squeegee assembly 40 has been positioned such that it engages the screen 36, urging a downward force on the screen 36, due to the blade 42 engaging the screen in a downwardly-pressing manner such that the screen comes into contact with the work 18, at the location of the blade 42 relative to the work 18, at any given moment. After the bar 41 completes its leftward traversal, a fluid activated, electrically controlled cylinder 44 exerts an upward pull through its linkage rod 45, on a squeegee arm 46, that in turn causes an eccentric in a bore in 47 to be pivoted about a shaft 48, in a counter-clockwise direction from that shown in FIG. 1, such that blade 42 is lifted upwardly from the screen 36, and blade 43 is pivoted downwardly into contact with the screen 36, whereupon the bar 41 is automatically actuated for rightward traversing movement, for wiping the ink rightward as viewed in FIG. 1, along the screen 36, to a suitable depository (not shown).

In accordance with the present invention, as the bar 41 moves leftwardly, an operational connection 50 through a suitable speed reducer 51, is in turn, operationally connected at 52, to the screen support frame 32, at its right end as viewed in FIG. 1, for synchronously raising the right end of the screen support frame 32 upwardly, such that the screen frame support, and consequently, the screen frame 35 and attached screen 36, are pivoted upwardly about the axis 33. The details of the sychronous motion, as well as adjustment means for varying the amount of raising the screen with the traversal motion of the squeegee 40, are more fully discussed hereinafter.

With reference now to FIGS. 2 through 6A, it will be seen that the squeegee support bar 41, carries an electrically operated motor 55 or the like, on its upper end, which motor 55 has a shaft 56 having a pinion gear 57 at its lower end, which pinion gear 57 is in meshed engagement with an elongated rack 58 carried by, and fixedly mounted on the carriage assembly 24. Thus, as the motor drives the gear 57 along the rack 58, the traversing bar 41 is caused to move leftwardly or rightwardly, as viewed in FIG. 2, by means of connection of the motor 55 to the bar 41 by conventional mounts (not shown).

As the bar 41 thus moves in its traversing motion, it also carries an air cylinder 60, having a vertically movable probe or keying member 61 in turn carried thereby. The probe 61 is movable upwardly, or downwardly, as air is delivered to either side of the cylinder 60, as determined by an electrical switching arrangment or the like, such that when it is desired to operate the apparatus 10 with the peel-off feature, the actuation of an appropriate switch (not shown) on the control panel or the like may cause the cylinder 60 to actuate the probe 61 to vertical downward movement, as shown in FIG. 3, such that its lower tip 62 enters into engagement between cross links of a continuous drive chain 62. The chain 63 is of the bicycle chain type, and is carried on customary sprocket members 64 or the like, in a conventional manner, which sprocket members 64 may be suitably carried for rotational movement on a rear member 65 of the carriage assembly 24. With particular reference to FIg. 4, it will be seen that a typical sprocket 64 may be mounted by suitable mounting members 66 carried by frame member 65, or the like, and with the lower end 62 of the probe 61 engaged in the chain 63, it will cause the chain to be moved in a traversing leftward or rightward motion with the bar 41, depending upon whether the squeegee is being moved in an ink applying, or flooding direction. With reference to the figures illustrated, as the bar 41 is being moved leftward, the chain 63 will be moved leftward, for raising the right-most end of the screen in a manner as will be discussed more fully hereafter. Alternatively, as the bar 41 is moved rightward as shown in the illustration, and when the lower end of the probe 61 is in engagement with the chain 63, the right end of the screen will be lowered to a substantially horizontal position, as will again become more fully apparent hereinafter.

It will be noted that the right end of the chain 63 as viewed in FIG. 4 is connected to a suitable speed reducer 51, that may comprise any suitable gearing arrangement as is desired to reduce the speed of the output shaft 67, to a suitable level.

With specific reference to FIg. 5, it will be noted that the pivot point or pivot axis 33 for the screen 36, is substantially precisely in line with the location of the screen, which geometric orientation will substantially preclude wiping of the screen along the substrate, as pivoting is effected, thereby substantially minimizing or precluding smearing, as aforesaid.

Also, with reference to FIG. 5, it will be noted that screw knob 70 having threaded shank 71, threaded through an overhanging angle iron portion 72 of the screen frame support 32, is manually actuable for engagement against the screen frame 35, at 73, for rigidly holding the screen frame 35, and consequently the screen 36, in the frame support 32, against a lower lip 74 thereof, to eliminate play or any other undesired movement during pivoting. It will be noted that a plurality of such clamp arrangements 70, 71, 72, are disposed about the assembly, as will appear more fully in the plan view of FIG. 2.

With particular reference to FIG. 6, it will be noted that the screen frame support 32, through rigidly connected angle iron portions 76, and 77, having an overhanging leg 78, are adapted to be engaged by a lift arm assembly, generally designated by the numeral 80. The pivot shaft 67 is internally threaded at 81, transversely thereof, for receipt therein of threaded shank 82 of a lift arm 83. The lift arm 83, thus forms the transverse lever, to the pivot lever 67, and is actuated thereby, to provide an upward lifting motion to the leg 78 of the screen frame support, as the pivot shaft 67 is moved in the clockwise direction indicated by the arrow 84 in FIG. 6 as the chain 63 is moved from right to left during motion of the bar 41 from right to left, as viewed in FIG. 1. At the left-most end of the lift arm 83 as viewed in FIG. 6, there is provided a generally hardened engagement ball 85 for axially engaging the undersurface of the screen frame support overhanging leg 78. Thus with particular reference to FIG. 6A, it is demonstrated how the angular or pivotal movement of the shaft 67 may cause the ball 85 of the lift arm 83 to engage the leg 78 of the screen frame support 32, and lift the screen frame support, and consequently, the screen, an amount determined by the distance D indicated, as the shaft 67 is rotated from the position illustrated in FIG. 6, to the position illustrated in FIG. 6A, or, as the right-most end of the screen is lifted from a zero lift disposition, to a full lift disposition, as the squeegee moves from right to left, in its traversing motion, from one end of the apparatus to the other, as discussed aforesaid.

It will be noted that the lift arm assembly 80 is provided with a hand knob 86, for manual adjustment of the position of contact of the lifting ball 85, on the overhanging leg 78 of the screen frame support, and for consequently providing some adjustment to the amount of lifting of the right end of the screen, upon pivoting of the shaft 67. In order to securely anchor the shaft 67 to the carriage assembly 24, a number of supports 87 are provided with suitable bearings therein for journaling the shaft 67.

A pair of guide blocks 90, 91, are carried on the carriage assembly, as illustrated in FIG. 2, rigidly connected therewith. A pair of guide blocks 92, 93 (spaced apart like the blocks 91, 90) are carried on upstanding leg 76 of screen frame support 32, rigidly connected therewith. A pair of hinge plates 94, 95 pivotally connected to each other at 96, by a suitable hinge pin or the like, extend from blocks 90, 93, to blocks 91, 92, as illustrated in FIG. 2. Hinge plate 95 is pivotally connected at 97 to carriage-assembly-carried blocks 90 and 91. Hinge plate 94 is likewise pivotally connected by suitable hinge pins or pivots 98 to screen-frame-support carried blocks 92, 93. As the lift arm assembly 80 lifts the screen frame support 32 as aforesaid, hinge plate ends 100, 101, 102 and 103, in close sliding fit with adjacent corresponding surfaces 104, 105, 106 and 107 of blocks 90, 91, 93 and 92, respectively, oppose and substantially preclude any looseness or "play", in the movement of the screen frame support, and consequently, of the screen, from upward-to-downward movement, whereby precise registration of a template or stencil provided by the screen is possible, from printing-to-printing, relative to a given location of work on the platen 17. Accordingly, the hinge plates 94, 95, so disposed and closely fitted relative to the blocks upon which their ends slide, assure precision alignment of the screen as it moves upwardly and downwardly about its pivot point.

It will be seen that the ends of the invention are accomplished, in providing a highly desirable mechanical peel-off for the screen, relative to the work, which assures precision snap-off by lifting the screen frame in synchronization with the squeegee, as the squeegee makes a printing stroke.

Consequently, this peel-off mechanism offers the advantage of higher printing speeds, while assuring precision snap-off, with minimum distortion-inducing off-contact between the screen and the substrate or work.

It will further be apparent that while various modifications may be made in the details of the invention different than that set forth in the embodiments herein disclosed, it will be understood that such variations or differences are within the scope of the invention set forth in the appended claims. For example, the term "squeegee" has been used in a broad way, as is used in the art, to describe a member suitable for pumping or pushing ink through a screen. The "inks" referred to may be suitable inks for graphic art patterns or resists for printed circuit patterns. Resists generally are coatings for marking, or protecting selected areas of the work or patterns on the work, from other substances such as etchant, solder, or plating. The inks may also be cover coatings, such as outer layers of insulating material applied over a conductor or other pattern on the surface of a printed member. Cover coatings can be applied without using a stencil in the screen, such as for overlays for smudge or scuff resistance in the graphic arts, or for environmental protection for printed circuit patterns—such as for protection against humidity, salt spray, handling, etc., or for dielectric protection of printed circuit patterns. In applying ink through a stencil, there are thus may uses of the invention in connection wth graphic arts images, printed circuit patterns, and solder masking. Thus, "printing" has been used in the broad sense as has been heretofore described. Other terms that have come to be used in the art are likewise used, not in a limiting sense, but in the broad sense.

What is claimed is:

1. In a screen printing apparatus including a table for carrying a blank to be printed, a screen for overlaying the blank and receiving printing fluid therein for squeezing therethrough, a squeegee for engaging the screen, a squeegee drive means including a traversing bar for driving the squeegee across the screen in traversing movement relative thereto whereby said squeegee can urge printing fluid through said screen, means for positively separating already traversed screen portions from said blank as said squeegee traverses said screen, synchronizing means synchronizing said positive separation with said traversing motion, wherein said synchronizing means comprises:

(a) a keying member carried by said traversing bar for keying the bar to a linkage member;

(b) a linkage member for driven engagement by said keying member as said keying member is carried by said traversing bar;

(c) speed reducer means connected to said linkage member for delivering a speed-reduced angular output motion in response to the driven motion of said linkage member; and (d) lever means connected to said speed reducer means and in raising-connected relation to said screen in accordance with the output motion of said speed reducer means.

2. The apparatus of claim 1 including means for manual adjustment of a predetermined amount of separation of said screen from said blank as the squeegee traverses the screen, the said manual adjustment means including a manually adjustable shaft bearing upon said screen.

3. The apparatus of claim 2 wherein said keying member is an air cylinder having a movable probe, and wherein said linkage means is a linked drive chain.

* * * * *